United States Patent
Park et al.

(10) Patent No.: US 7,551,487 B2
(45) Date of Patent: Jun. 23, 2009

(54) NONVOLATILE MEMORY DEVICE AND RELATED PROGRAMMING METHOD

(75) Inventors: Min-Gun Park, Suwon-si (KR); Sung-Jyu Jo, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 253 days.

(21) Appl. No.: 11/716,043

(22) Filed: Mar. 9, 2007

(65) Prior Publication Data

US 2007/0211537 A1    Sep. 13, 2007

(51) Int. Cl.
G11C 16/06    (2006.01)

(52) U.S. Cl. .......................... 365/185.22; 365/185.17; 365/185.23

(58) Field of Classification Search ............ 365/185.22, 365/185.17, 185.23
See application file for complete search history.

(56) References Cited

U.S. PATENT DOCUMENTS

| | | | | |
|---|---|---|---|---|
| 6,954,380 | B2 * | 10/2005 | Ono et al. .............. | 365/185.24 |
| 7,110,286 | B2 * | 9/2006 | Choi et al. ................... | 365/163 |
| 7,184,356 | B2 * | 2/2007 | Noguchi et al. ........ | 365/230.03 |
| 2004/0062078 | A1 | 4/2004 | Kasa et al. | |
| 2005/0190602 | A1 | 9/2005 | Nakamura et al. | |

FOREIGN PATENT DOCUMENTS

| | | |
|---|---|---|
| JP | 2003-249082 | 9/2003 |
| JP | 2004-046996 | 2/2004 |
| JP | 2004-110871 | 4/2004 |
| KR | 1020030051402 A | 6/2003 |
| KR | 1020040024450 A | 3/2004 |

* cited by examiner

*Primary Examiner*—Van Thu Nguyen
*Assistant Examiner*—Han Yang
(74) *Attorney, Agent, or Firm*—Volentine & Whitt, PLLC (57) ABSTRACT

In a nonvolatile memory device, a first verification result indicates whether a block of memory cells has been successfully programmed and a second verification result indicates whether a far cell in the block has been is successfully programmed. A controller defines the level and application time for the program voltage applied during a next program loop in response to the first and second verification results.

16 Claims, 8 Drawing Sheets

NONVOLATILE MEMORY DEVICE AND RELATED PROGRAMMING METHOD

BACKGROUND OF THE INVENTION

1. Field of the Invention

Embodiments of the invention relate generally to nonvolatile memory devices. More particularly, embodiments of the invention relate to nonvolatile memory devices and related programming methods having improved performance relative to conventional nonvolatile memory devices and programming methods.

A claim of priority is made to Korean Patent Application No. 2006-22789, filed on Mar. 10, 2006, the disclosure of which is hereby incorporated by reference in its entirety.

2. Description of Related Art

Semiconductor memory devices can be roughly divided into two categories including volatile semiconductor devices and nonvolatile semiconductor memory devices. Volatile semiconductor memory devices tend to have faster read and write times than nonvolatile semiconductor memory devices. However, unlike nonvolatile semiconductor memory devices, volatile semiconductor memory devices lose stored data when disconnected from an external power source. As a result, nonvolatile semiconductor memory devices are often used to store data in electronic devices where power is limited or may be unexpectedly cut off.

There are currently many different types of nonvolatile semiconductor memory devices in existence. Examples of these devices include masked read-only memory (MROM), programmable read-only (PROM), erasable programmable read-only memory (EPROM), and electrically erasable programmable read-only memory (EEPROM), to name but a few.

Unfortunately, it has traditionally been difficult for users to update data stored in MROM, PROM, and EPROM due at least in part to difficulties in performing erase operations. However, EEPROM can be readily programmed and erased by applying appropriate voltages to individual memory cells.

One especially popular form of EEPROM is flash memory. Flash memory is popular for a wide variety of reasons, including, for example, its high degree of integration compared with other forms of EEPROM, its durability, and its performance. Among flash memories, NAND flash memory has an especially high degree of integration. Accordingly, NAND flash memory is commonly used to provide mass data storage for electronic devices.

Figure 1:
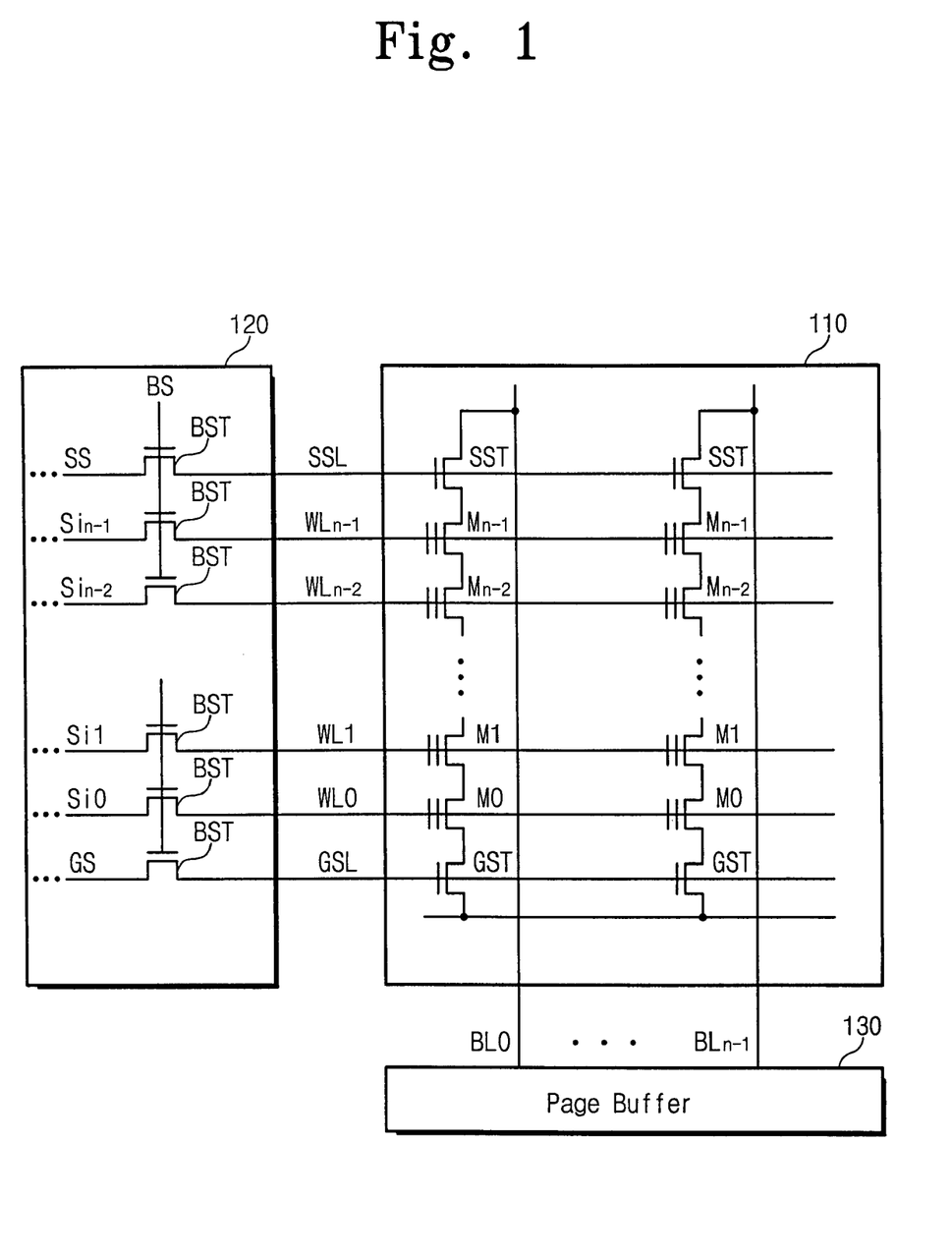
FIG. 1 is a schematic block diagram illustrating various features of a conventional NAND flash memory.

FIG. 1 is a schematic diagram illustrating various features of a conventional NAND flash memory device. Referring to FIG. 1, the conventional NAND flash memory device comprises a memory cell array 110, a row decoder circuit 120, and a page buffer circuit 130. Within memory cell array 110, rows are driven by row decoder circuit 120, and columns are driven by page buffer circuit 130.

Memory cell array 110 comprises a plurality of memory cells divided into a plurality of memory cell blocks. For simplicity of illustration, FIG. 1 shows a single memory cell block of memory cell array 110. Other memory cell blocks in memory cell array 110 have similar functions and structures to the one illustrated. The memory cell block shown in FIG. 1 comprises a plurality of NAND strings, a plurality of word lines WL0 through WLn-1, a plurality of bit lines BL0 through BLm-1, a string select line SSL, and a ground select line GSL.

Each NAND string in the memory cell block comprises a plurality of floating gate transistors M0 through Mn-1 connected in series between a corresponding ground select transistor GST and a corresponding string select transistor SST. Each of floating gate transistors M0 through Mn-1 has a gate connected to a corresponding one of word lines WL0 through WLn-1. Each ground select transistor GST has a gate connected to ground select line GSL. Each string select transistor SST has a gate connected to string select line SSL. In addition, each string select transistor SST is connected to a corresponding bit line among bit lines BL0 through BLm-1.

Row decoder circuit 120 comprises a plurality of block select transistors BST commonly controlled by a block select control signal BS. One of block select transistors BST is connected to string select line SSL to provide a string select signal SS to string select line SSL. Another one of block select transistors BST is connected to ground select line GSL to provide a ground select signal GS to ground select line GSL. Remaining block select transistors BST are connected to respective word lines WL0 through WLn-1 to provide respective select signals Si0 through Sin-1 to respective word lines WL0 through WLn-1.

Page buffer circuit 130 comprises a plurality of page buffers connected to respective bit lines BL0 through BLm-1. In some embodiments, each page buffer is connected to a pair of bit lines among bit lines BL0 through BLm-1.

In a program operation of the conventional NAND flash memory device, such as the one illustrated in FIG. 1, row decoder circuit 120 selects a word line among word lines WL0 through WLn-1 based on row address information, supplies a program word line voltage to the selected word line, and supplies a program-inhibit word line voltage to remaining word lines among word lines WL0 through WLn-1. Page buffer circuit 130 receives and stores data to be programmed into memory cell array 110 during the program operation. Page buffer circuit 130 drives each of bit lines BL0 through BLm-1 with a program bit line voltage or a program-inhibit bit line voltage depending on the data to be programmed into memory cell array 110.

In a read operation of the conventional NAND flash memory device, such as the one illustrated in FIG. 1, row decoder circuit 120 selects a word line among word lines WL0 through WLn-1 based on row address information and supplies a read word line voltage to the selected word line and a read-inhibit word line voltage to remaining word lines among word lines WL0 through WLn-1. In the read operation, page buffer circuit 130 drives each of bit lines BL0 through BLm-1 with a read bit line voltage and senses and stores data stored in memory cells connected to the selected word line through bit lines BL0 through BLm-1.

Similarly, in a verify read operation of the conventional NAND flash memory device, such as the one illustrated in FIG. 1, row decoder circuit 120 selects a word line among word lines WL0 through WLn-1 based on row address information and supplies a verify read word line voltage to the selected word line and a read-inhibit word line voltage to remaining word lines among word lines WL0 through WLn-1. In the verify read operation, page buffer circuit 130 drives each of bit lines BL0 through BLm-1 with the read bit line voltage and senses and stores data stored in memory cells connected to the selected word line through bit lines BL0 through BLm-1.

Page buffer circuit 130 detects and stores data stored in memory cells connected to the selected word line through bit lines BL0 through BLm-1.

To supply the appropriate voltages to word lines WL0 through WLn-1 during the program, read, and verify read operations, row decoder circuit 120 receives select signals Si0 to Sin-1 from a word line driver (not shown). Row decoder circuit 120 then supplies select signals Si0 through Sin-1 to respective word lines WL0 through WLn-1. Select signals Si0 through Sin-1 have voltage levels corresponding to the program word line voltage, the program-inhibit word line voltage, the read word line voltage, and the read-inhibit word line voltage, depending on which word line is selected, and which operation is being performed.

NAND flash memory is often erased and programmed using a technique commonly referred to as Fowler-Nordheim tunneling. Various methods for erasing and programming NAND flash EEPROM cells are disclosed, for example, in U.S. Pat. No. 5,473,563 entitled "NONVOLATILE SEMICONDUCTOR MEMORY", and in U.S. Pat. No. 5,696,717 entitled "NONVOLATILE INTEGRATED CIRCUIT MEMORY DEVICES HAVING ADJUSTABLE ERASE/PROGRAM THRESHOLD VOLTAGE VERIFICATION CAPABILITY".

A flash memory device may be programmed using an incremental step pulse programming (ISPP) technique to accurately control the threshold voltage distribution for memory cells in the device. One example of a conventional ISPP technique is described, for example, in U.S. Pat. No. 5,642,309 entitled "AUTO-PROGRAM CIRCUIT IN A NONVOLATILE SEMICONDUCTOR MEMORY DEVICE".

Figure 2:
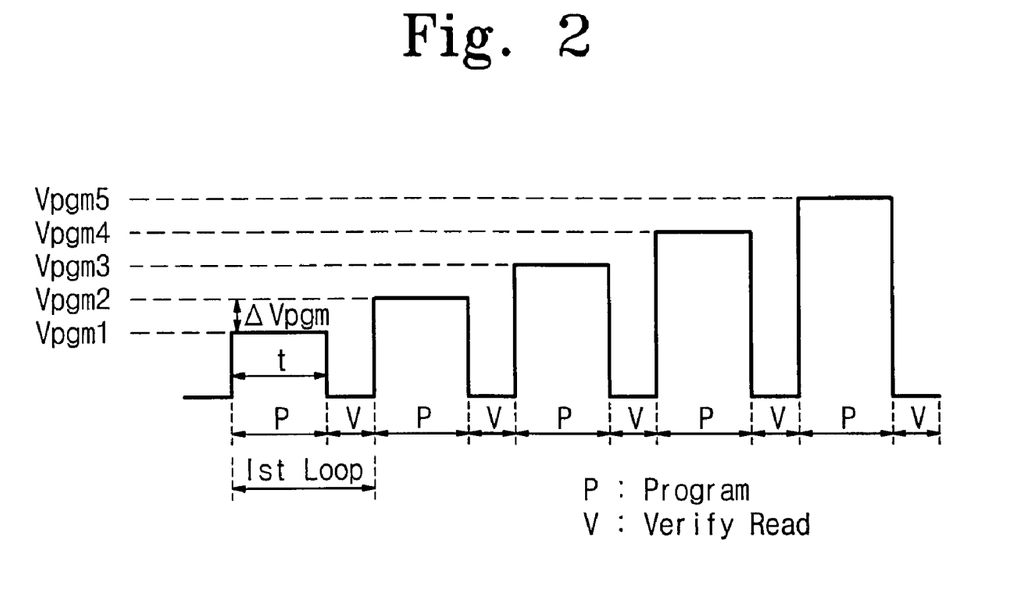
FIG. 2 is a voltage diagram illustrating a voltage level applied to a word line of a NAND flash memory during a program operation using an ISPP technique.

FIG. 2 is a graph illustrating a change in a program word line voltage during a program operation for a NAND flash memory device using a conventional ISPP technique. For explanation purposes, it will be assumed that the ISPP technique of FIG. 2 is performed using the conventional NAND flash memory device illustrated in FIG. 1.

Referring to FIGS. 1 and 2, in the program operation, address data and program data are provided to the NAND flash memory device. Row decoder circuit 120 selects a word line among word lines WL0 through WLn-1 based on the address data and page buffer circuit 130 stores the program data. Typically, the program data comprises a unit of data such as a byte or a word.

The program operation comprises a sequence of program loops each comprising a program period (denoted "P" in FIG. 2) and a verify read period (denoted "V" in FIG. 2).

During the program period, page buffer circuit 130 applies the program bit line voltage and/or the program-inhibit bit line voltage to bit lines BL0 through BLm-1 based on the program data, and row decoder 120 applies the program word line voltage to the selected word line. The application of these voltages to corresponding bit and word lines tends to increase the threshold voltages of selected memory cells in the NAND flash memory device to be programmed with a logical "0".

During the verify read period, a verify read operation is performed to detect whether the respective threshold voltages of the selected memory cells are at desired levels. In the verify read operation, page buffer circuit 130 applies the verify read bit line voltage to bit lines BL0 through BLm-1, and row decoder 120 applies the verify read word line voltage to the selected word line to sense the threshold voltage levels of the selected memory cells.

Where the threshold voltages of the selected memory cells are within desired threshold voltage distributions, the program operation is completed. Otherwise, another program loop is repeated with the program word line voltage having a level increased by an increment $\Delta V_{pgm}$ as illustrated in FIG. 2. In the example of FIG. 2, five program loops are executed with the program word line voltage having increasing magnitudes labeled Vpgm1 through Vpgm5.

In NAND flash memories, such as the one illustrated in FIG. 1, a set of memory cells connected to the same word line are generally referred to as a "page" of memory cells. In a program operation such as that described above in relation to FIGS. 1 and 2, a page of data is generally programmed in parallel with a page of selected memory cells.

As the degree of integration in NAND flash memory device increases, the number of memory cells connected to each word line also increases. Unfortunately, as a result, the effective load capacitance for each memory cell connected to a word line may vary significantly in accordance with its location along the word line. Accordingly, the magnitude of the program word line voltages apparent at different memory cells during a program operation may vary—being attenuated at memory cells having a further distance from row decoder circuit 120. This results proves troubling since the effective load capacitance may affect the timing of the program word line voltages apparent at different memory cells.

Due to these load capacitance effects, program operations in conventional NAND flash memory devices may be limited by the timing requirements of memory cells located furthest from row decoder circuit 120. For example, the duration of each program period for a page of memory cells connected to a word line must be sufficiently long to ensure that selected memory cells located furthest from row decoder circuit 120 along the word line receive the program word line voltage for a time sufficiently long to elevate their threshold voltages by a desired amount. However, timing requirements such as these may significantly impair the overall operational performance of NAND flash memory devices.

SUMMARY OF THE INVENTION

In one embodiment, the invention provides a nonvolatile memory device, comprising; a memory cell array comprising memory cells selected by word lines and bit lines, a row decoder circuit providing a program voltage to a selected word line, a first verification circuit providing a first verification result indicating whether or not memory cells in a predetermined bit unit and programmed by the program voltage are successfully programmed, a second verification circuit providing a second verification result indicating whether or not a far cell within the predetermined bit unit is successfully programmed, a controller defining a level and an application time for a program voltage applied during a next program loop in response to the first and second verification results, a word line voltage generating circuit generating the program voltage, and a word line driver supplying the program voltage to the row decoder during the next program loop.

In another embodiment, the invention provides a method for programming a non-voltage memory device having memory cells selected by word lines and bit lines, the method comprising; applying a program voltage to a selected word line through a row decoder, verifying whether or not memory cells in a predetermined bit unit programmed by the program voltage are successfully programmed and providing a corresponding first verification result, verifying whether or not a far cell amongst the memory cells in the predetermined bit unit is successfully programmed and providing a corresponding second verification result, and adjusting a level and application time for a program voltage applied during a next program loop in response to the first and second verification results.

BRIEF DESCRIPTION OF THE DRAWINGS

In this written description, embodiments of the invention are described in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Briefly, selected embodiments of the invention provide nonvolatile memory devices and related programming methods wherein a duration with which a program word line voltage is applied to a selected word line is adjusted in successive program loops according to whether a memory cell located furthest from a row decoder circuit along the selected word line has been successfully programmed. By adjusting this duration, the reliability and performance of nonvolatile memory devices according to selected embodiments of the invention are improved relative to conventional nonvolatile memory devices.

Figure 3:
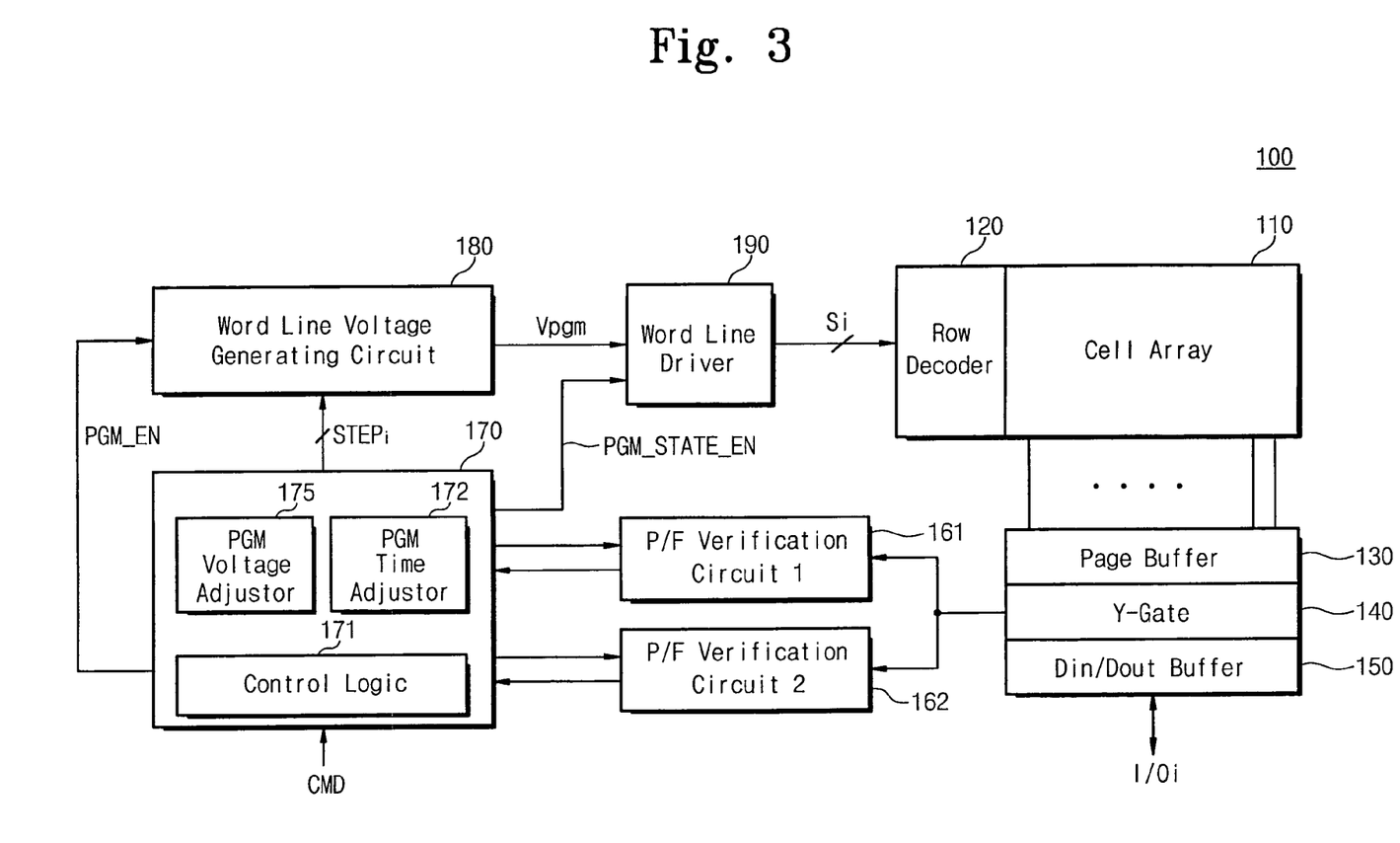
FIG. 3 is a block diagram of a nonvolatile memory device according to one embodiment of the present invention.

FIG. 3 is a block diagram of a nonvolatile memory device 100 according to one embodiment of the present invention. For explanation purposes, it will be assumed that nonvolatile memory device 100 is a NAND flash memory device. However, those skilled in the art will understand that nonvolatile memory device 100 could have a different structure besides that of a NAND flash memory device. In addition, it will be assumed that nonvolatile memory device 100 includes single-level memory cells; however, nonvolatile memory device 100 could be readily modified to use multi-level memory cells.

Referring to FIG. 3, nonvolatile memory device 100 comprises a memory cell array 110, a row decoder circuit 120, a page buffer circuit 130, a column gate circuit 140 (Y-GATE), a data input/output (I/O) buffer circuit 150, first and second pass/fail (P/F) verification circuits 161 and 162, a controller 170, a word line voltage generating circuit 180, and a word line driver 190. The structure and operating principles of memory cell array 110, row decoder circuit 120, and page buffer circuit 130 are substantially the same as those of the NAND flash memory illustrated in FIG. 1. Accordingly, redundant explanation of these features will be omitted in order to be concise.

In read, verify read, and program operations of nonvolatile memory device 100, row decoder circuit 120 selects a memory block and a row of the memory block within memory cell array 110 based on address information provided from an external source. Word line voltage generating circuit 180 generates word line voltages (e.g., program word line voltage, program-inhibit word line voltage, read word line voltage, etc.) and row decoder circuit 120 supplies the word line voltages to corresponding word lines.

The word line voltages are typically not directly applied from word line voltage generating circuit 180 to row decoder circuit 120. Instead, the word line voltages are transferred from word line voltage generating unit 180 to word line driver 190. Word line driver 190 receives the word line voltages and uses the word line voltages to generate select signals Si0 through Sin-1 to be applied to rows of the selected memory block. Select signals Si0 through Sin-1 can have voltage levels corresponding to the program word line voltage, the program-inhibit word line voltage, and the read word line voltage, depending on a type of operation being performed, and depending on which row of the selected memory block is selected.

Page buffer circuit 130 is controlled by controller 170. Each page buffer within page buffer circuit 130 can act as a sense amplifier and as a write driver depending on an operating mode of nonvolatile memory device 100. More particularly, where nonvolatile memory device 100 is performing a read operation or a verify read operation, nonvolatile memory device 100 is in a read mode, and therefore page buffers within page buffer circuit 130 act as sense amplifiers, and where nonvolatile memory device 100 is performing a program operation, nonvolatile memory device 100 is in a program mode, and therefore page buffers within page buffer circuit 130 act as write drivers.

Read data stored in page buffer circuit 130 during a read operation is output through column gate circuit 140 and data I/O buffer circuit 150. On the other hand, read data stored in page buffer circuit 130 during a verify read operation is supplied to first and second P/F verify circuits 161 and 162 through column gate circuit 140. Program data to be programmed in memory cell array 110 during a program operation is input to page buffer circuit 130 through data I/O buffer circuit 150 and column gate circuit 140. Based on the program data, bit lines BL0 through BLm-1 are driven with the program bit-line voltage (e.g., ground) and the program-inhibit bit line voltage (e.g., a power voltage).

In a verify read operation of nonvolatile memory device 100, first P/F verification circuit 161 verifies whether or not memory cells within a selected page are successfully programmed, and second P/F verification circuit 162 verifies whether a memory cell within a selected page located furthest away from row decoder 120 is successfully programmed. This verify read operation is performed during the verification period of each program loop under the control of controller 170. For simplicity of explanation, a memory cell located furthest from row decoder 120 along a selected word line will be referred to as a "far cell" of the selected word line or of a selected page corresponding to the selected word line. Accordingly, second P/F verification circuit 162 verifies the far cell of the selected page during the verify read operation. Moreover, a bit of data stored in the far cell of a selected page or word line will be referred to as a far bit of the selected page or word line.

First P/F verification circuit 161 typically performs the verify read operation on selected memory cells in parallel. For example, where each page of memory cells in memory cell array 110 comprises 128 memory cells in addition to the far cell, first P/F verification circuit 161 performs the verification in parallel for 128 bits read from the 128 respective memory cells via 128 respective I/O lines connected to bit lines BL0 through BLm-2. First P/F verification circuit 161 can perform the verification, for example, by computing an XOR operation between program data used to program the 128 memory cells and the 128 bits read from the 128 memory cells to detect whether the program data is the same as the 128 bits.

Second P/F verification circuit 162 performs the verify read operation on the "far bit" of the selected page. The far bit is transferred to second P/F verification circuit 162 via an I/O line connected to bit line BLm-1, which is located furthest from row decoder circuit 120 among bit lines BL0 through BLm-1. The verify read operation of second P/F verification circuit 162 is typically performed in parallel with the verify read operation of first P/F verification circuit 161.

The verify read operation generally terminates after it detects that either all of the memory cells within the selected page have been successfully programmed, or after it detects that one or more of the memory cells within the selected page has not been successfully programmed. In this written description, the term "successfully programmed" indicates that a memory cell has been programmed to within a desired threshold voltage distribution. Memory cells for which at least one program period has been executed, but which have not been successfully programmed, will be referred to as "failed cells".

Controller 170 controls program operations of nonvolatile memory device 100. Controller 170 comprises a control logic unit 171, a program time controller 172, and a program voltage adjuster 175. Controller 170 generates a program voltage enable signal PGM_EN, a program step code STEPi, and a program state enable signal PGM_STATE_EN in response to program commands CMD received through I/O pins I/Oi and program verification results produced by first and second P/F verification circuits 161 and 162.

Program voltage enable signal PGM_EN is used to activate word line voltage generating circuit 180 to generate the program word line voltage. Program step code STEPi is used to increase the level of the program word line voltage applied to cell array 110 in successive program loops. Program state enable signal PGM_STATE_EN is activated during the programming period of each program loop so that word line driver 190 drives word lines WL0 through WLn-1 with the program word line voltage and program-inhibit word line voltages.

The program word line voltage is applied to the selected word line during a period where program state enable signal PGM_STATE_EN is activated (e.g., has a logic level "high"). The duration for which program state enable signal PGM_STATE_EN is activated is determined by a program verification result of second P/F verification circuit 162. For example, where the program verification result of second P/F verification circuit 162 indicates that the far cell of the selected page has been successfully programmed, program state enable signal PGM_STATE_EN may be activated for a relatively shorter duration.

Word line generation circuit 180 generates the program word line voltage in response to program enable signal PGM_EN and program step code STEPi. Word line generation circuit 180 generates the program word line voltage using an ISPP technique. In the ISPP technique, the program word line voltage increases by a predetermined voltage increment $\Delta Vpgm$ in successive loops of a program operation.

Word line voltage driver 190 receives the program word line voltage and program-inhibit word line voltages from word line voltage generating circuit 180 and generates select signals SS, Si0 through Sin-1, and GS, which are supplied to row decoder circuit 120. Word line voltage driver 190 uses the program word line voltage to generate one of select signals Si0 through Sin-1 and uses the program-inhibit word line voltage to generate remaining select signals among select signals Si0 through Sin-1. The duration for which the one of select signals Si0 through Sin-1 is generated using the program word line voltage is determined by the program verification result of second P/F verification circuit 162.

Figure 4:
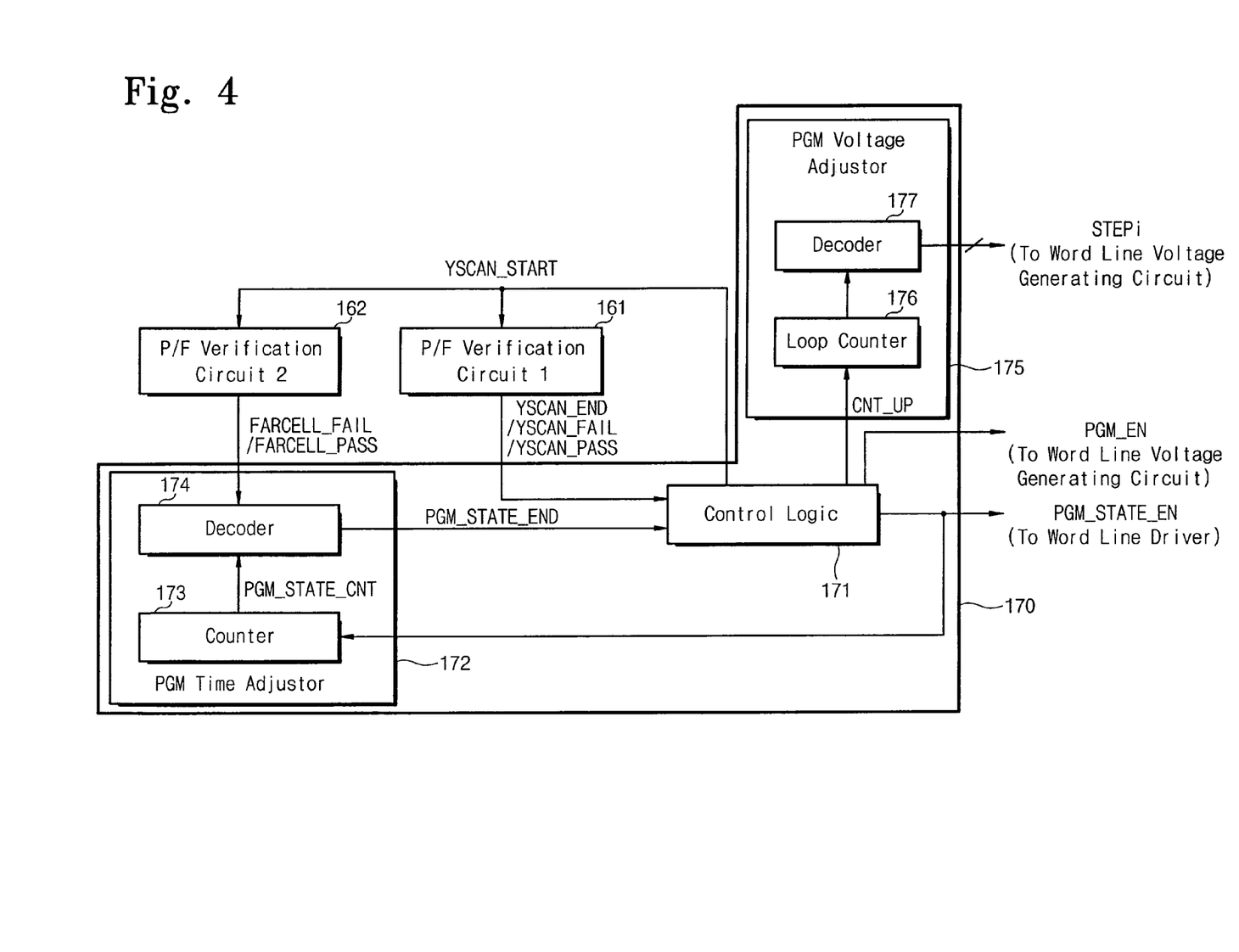
FIG. 4 is a block diagram of a controller illustrated in FIG. 3.

FIG. 4 is a block diagram illustrating an embodiment of controller 170 illustrated in FIG. 3 and further illustrating control signals transmitted between controller 170 and first and second P/F verification circuits 161 and 162.

Referring to FIG. 4, controller 170 comprises a control logic unit 171, a program time adjustor 172, and a program voltage adjustor 175. Control logic unit 171 controls program operations of nonvolatile memory device 100. Program voltage adjustor 175 adjusts a level of the program word line voltage during each program loop. Program time adjustor 172 adjusts a duration for which the program word line voltage is applied to the selected word line according to whether the far cell of the selected word line has been successfully programmed.

Control logic unit 171 implements a state machine. The state machine stores state information indicating a state of a program operation such as a number of program loops that have been performed in the program operation or whether the program operation is in a program period or a verify read period. During each program period of the program operation, control logic unit 171 generates program voltage enable signal PGM_EN to activate word line voltage generating circuit 180 to generate the program word line voltage. During each verify read period of the program operation, control logic unit 171 generates a scan start signal YSCAN_START to control first and second P/F verification circuits 161 and 162 to perform verify read operations.

First and second P/F verification circuits 161 and 162 typically perform the verify read operation using a wired-OR technique or a column scan technique (referred to hereafter as a Y-scan technique). The Y-scan technique is illustrated in FIGS. 3 and 4. However, those skilled in the art will recognize that the wired-OR technique could be performed by nonvolatile memory device 100 if various modifications were made, for example, to data input/output operations of memory cell array 110.

First P/F verification circuit 161 outputs various signals to control logic unit 171, including verification signals YSCAN_END, YSCAN_FAIL, and YSCAN-PASS. Second P/F verification circuit 162 outputs various signals to program time adjustor 172, including verification signals FARCELL-_FAIL and FARCELL_PASS.

Control logic unit 171 generates an activated count-up signal CNT_UP and a program state enable signal PGM-_STATE_EN in response to verification signals YSCAN_END, YSCAN_FAIL, and YSCAN-PASS. Count up signal CNT_UP is applied to program voltage controller 175 and is used to adjust a level of the program word line voltage during a next program loop. Program state enable signal PGM_STATE_EN is simultaneously applied to word line driver 190 and program time adjustor 172. Program time adjustor 172 adjusts an end point of program state enable signal PGM_STATE_EN (i.e., an endpoint of a time during which the program word line voltage is applied to the selected memory cells during a program loop following a verify operation) in response to verification signals FARCELL_FAIL and FARCELL_PASS of second pass/fail verification circuit 162.

Program voltage adjustor 175 comprises a loop counter 176 and a decoder 177. Control logic unit 171 activates count-up signal CNT_UP in response to verification signal YSCAN-_FAIL where verification signal YSCAN_FAIL indicates that selected memory cells have not been successfully programmed following a program loop. On the other hand, control logic unit 171 deactivates (i.e., change to logic level "low") count-up signal CNT_UP and terminates a program operation in response to verification signal YSCAN_PASS or verification signal YSCAN_END where verification signal YSCAN_PASS indicates that selected memory cells have not been successfully programmed after a predetermined number of program loops or where verification signal YSCAN_END indicates that selected memory cells have been successfully programmed.

Loop counter 176 counts a number of program loops in response to count-up signal CNT_UP. Decoder 177 decodes an output of loop counter 176 to generate program step code STEPi (i ∈ {0, ..., n}). Program step code STEPi is input to word line voltage generating circuit 180. As the output value of loop counter 176 increases, program step code STEPi is updated according to a predetermined pattern. As program step code STEPi is updated, word line voltage generating circuit 180 generates the program word line voltage with a level increased by the voltage increment ΔVpgm. Voltage increment ΔVpgm can be adjusted according to a user or memory designer's specification.

As described above, where program state enable signal PGM_STATE_EN is activated, the program word line voltage generated by word line voltage generating circuit 180 is applied to the selected word line. On the other hand, where program state enable signal PGM_STATE_EN is deactivated, the program word line voltage is not applied to the selected word line. Accordingly, by adjusting time points where program state enable signal PGM_STATE_EN is initially activated or deactivated, the duration with which the program word line voltage is supplied to the selected word line can be adjusted. The time points where program state enable signal PGM_STATE_EN is initially activated or deactivated are determined by the program verification result produced by second P/F verification circuit 162.

Program time adjustor 172 comprises a counter 173 and a decoder 174. Counter 173 is initialized in response to program state enable signal PGM_STATE_EN and increases a counter value in synchronization with an internal clock signal as time passes. In other words, counter 173 counts an elapsed time since the beginning of a program operation and outputs a counter value PGM_STATE_CNT in accordance with the elapsed time.

Decoder 174 receives counter value PGM_STATE_CNT and generates a program state end signal PGM_STATE_END in response to counter value PGM_STATE_CNT and the program verification result of second P/F verification circuit 162 performed before. For example, where the far cell of the selected page has not been successfully programmed, decoder 174 performs decoding to delay program state end signal PGM_STATE_END by a predetermined time in response to verification signal FARCELL_FAIL. On the other hand, where the far cell of the selected page is successfully programmed, decoder 174 performs decoding to advance program state end signal PGM_STATE_END by a predetermined time in response to verification signal FARCELL_FAIL.

Control logic unit 171 adjusts the duration of program state enable signal PGM_STATE_EN based on program state end signal PGM_STATE_END. Where program state enable signal PGM_STATE_EN is deactivated, the program word line voltage is not supplied to the selected word line. Accordingly, program time adjustor 172 adjusts a time for which the program word line voltage is applied to adjusted according to a program state of the far cell of the selected page of nonvolatile memory device 100.

As described above, nonvolatile memory device 100 adjusts a duration for which the program word line voltage is applied to the selected word line during each program loop of the program operation according to whether the far cell of the selected word line. As a result, the reliability of nonvolatile memory device 100 has increased reliability relative to conventional nonvolatile memory devices.

Figure 5:
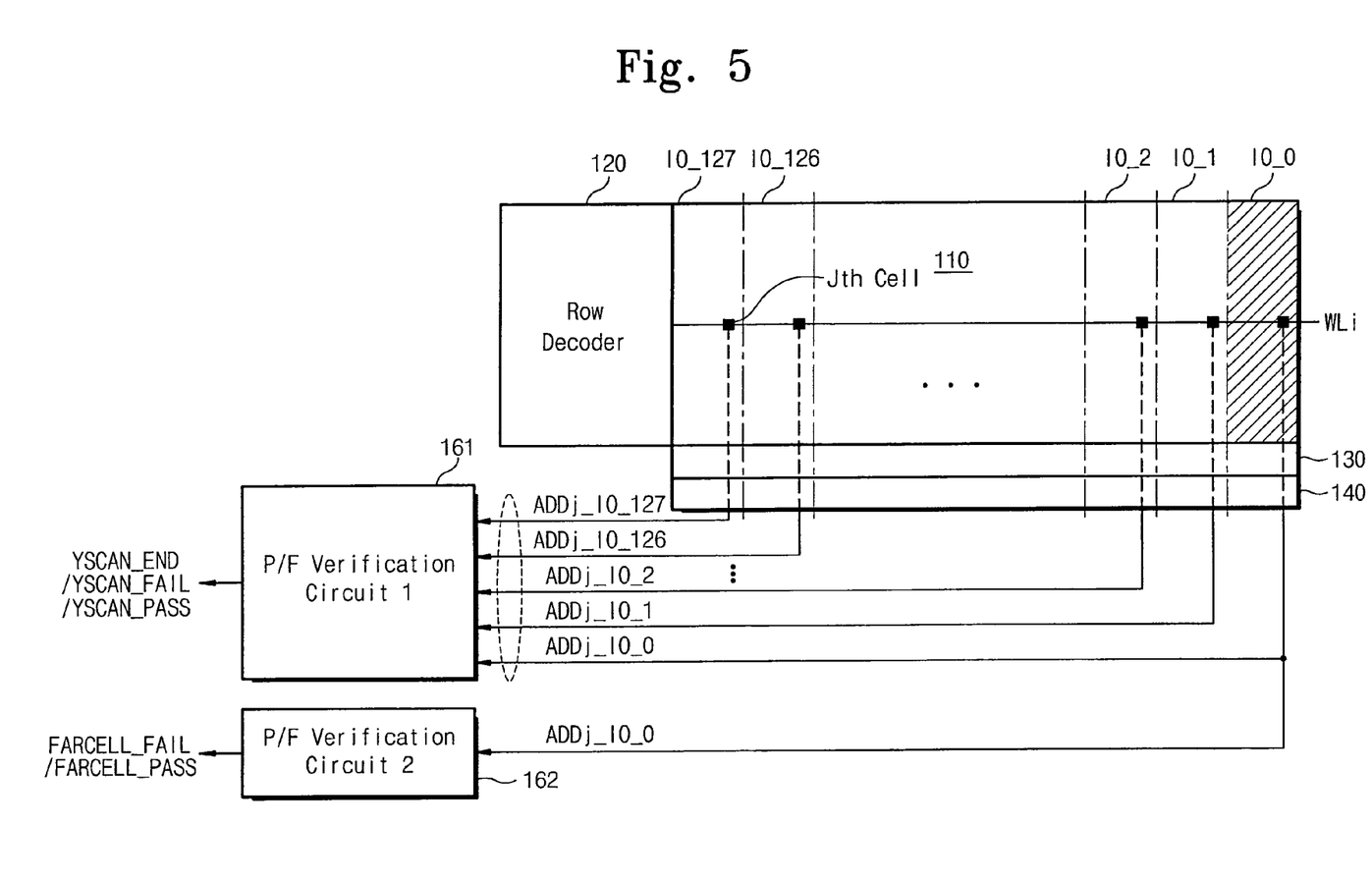
FIG. 5 is a block diagram illustrating the operation of first and second pass/fail (P/F) verification circuits shown in FIG. 3 during a verify read operation according to one embodiment of the invention.

FIG. 5 is a block diagram further illustrating the operation of first and second P/F verification circuits 161 and 162 during a verify read operation according to one embodiment of the invention. In the example illustrated in FIG. 5, memory cell array 110 comprises 128 physical I/O lines ADDj_IO_0 through ADDj_IO_127, and row decoder 120 in connected to row lines WLi traversing memory cell array 110. The illustrated example of FIG. 5 is, however, just one example of many possible circuit arrangements susceptible to the benefits of the present invention. For example, row decoder 120 might be connected to more than one memory cell array, or the number of physical I/O lines in memory cell array 110 might be varied, etc.

In the example of FIG. 5, each of physical I/O lines ADDj_IO_0 through ADDj_IO_127 is connected to a corresponding NAND string in memory cell array 110. During the read verify operation, the memory cells in IOs IO_0 through IO_127 are sequentially scanned under the control of column gate circuit 140 to verify program state.

In the verify read operation, first P/F verification circuit 161 verifies whether all 128 bits stored in the selected page have been successfully programmed by comparing the 128 bits stored in the selected page with 128 corresponding bits of program data. This bit for bit comparison is performed in parallel. Also, in the verify read operation, second P/F verification circuit 162 verifies whether the far bit of the selected page has been successfully programmed by comparing the far bit with a corresponding bit of program data.

The far bit is output from memory cell array 110 to second P/F verification circuit 162 via a physical I/O line ADDj_IO_0 which is the physical I/O line located farthest from row decoder circuit 120 among the 128 physical IO lines shown in the illustrated example of FIG. 5. The verify read operation of second P/F verification circuit 162 may be performed in parallel with the verify read operation of the first P/F verification circuit 161. The verify read operation may be repeatedly performed by sequentially increasing an address value successively indicating each IO until a failed cell is detected amongst the memory cells of the selected page, or until all memory cells of the selected page are determined to be successfully programmed.

For example, first P/F verification circuit 161 verifies (in parallel) the program state of first memory cells ADD1_IO_0 through ADD1_IO_127 associated with IOs IO_0 through IO_127, then verifies the program state of second memory cells ADD1_IO_0 to ADD1_IO_127 associated with IOs IO_0 to IO_127, and so on. When a failed cell is detected during a verify read operation of first P/F verification circuit 161, the verify read operation stops, and then the program operation of the next loop is performed. At this point, an address in each IO where the verify operation stops is stored in a data storage unit (not shown) such as a register associated with controller 170. This address is subsequently provided as a start address for the next verify operation.

Figure 6A:
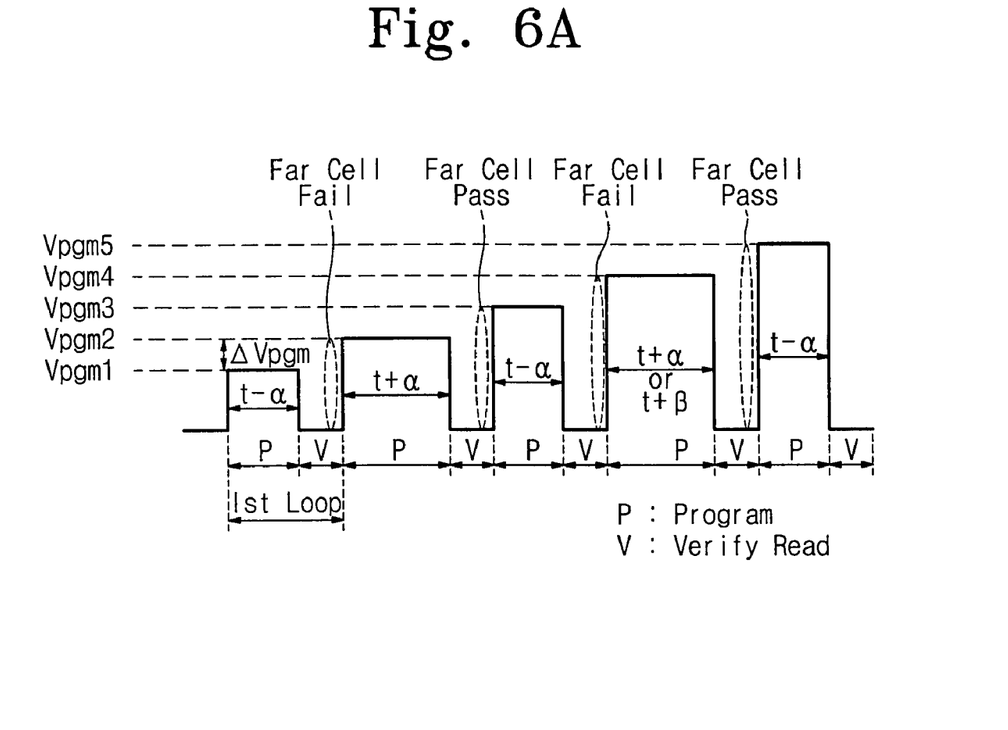
FIGS. 6A through 6C are voltage diagrams illustrating voltage levels applied to a word line of a NAND flash memory during respective program operations according to selected embodiments of the invention.
Figure 6B:
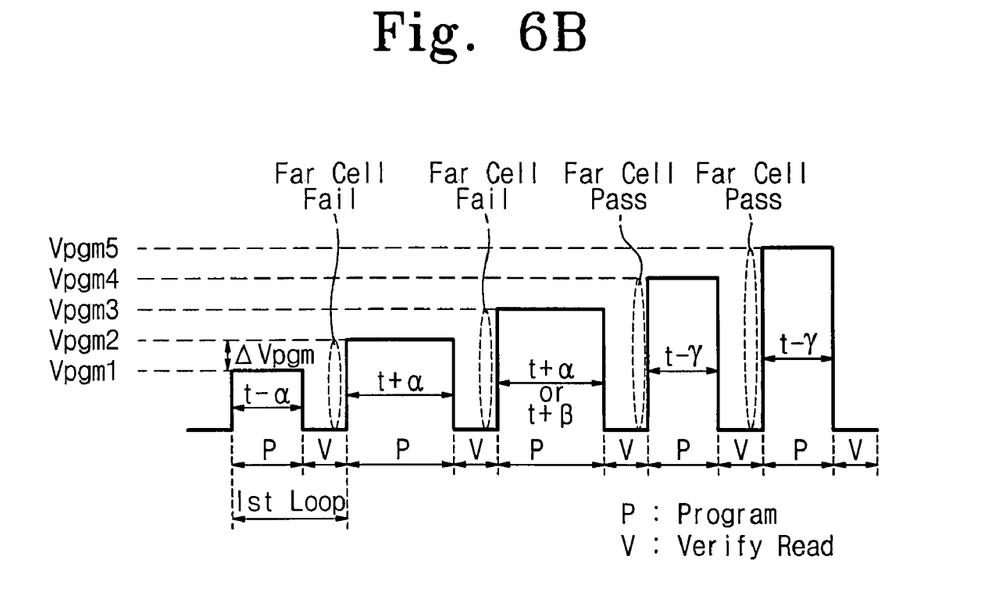
Figure 6C:
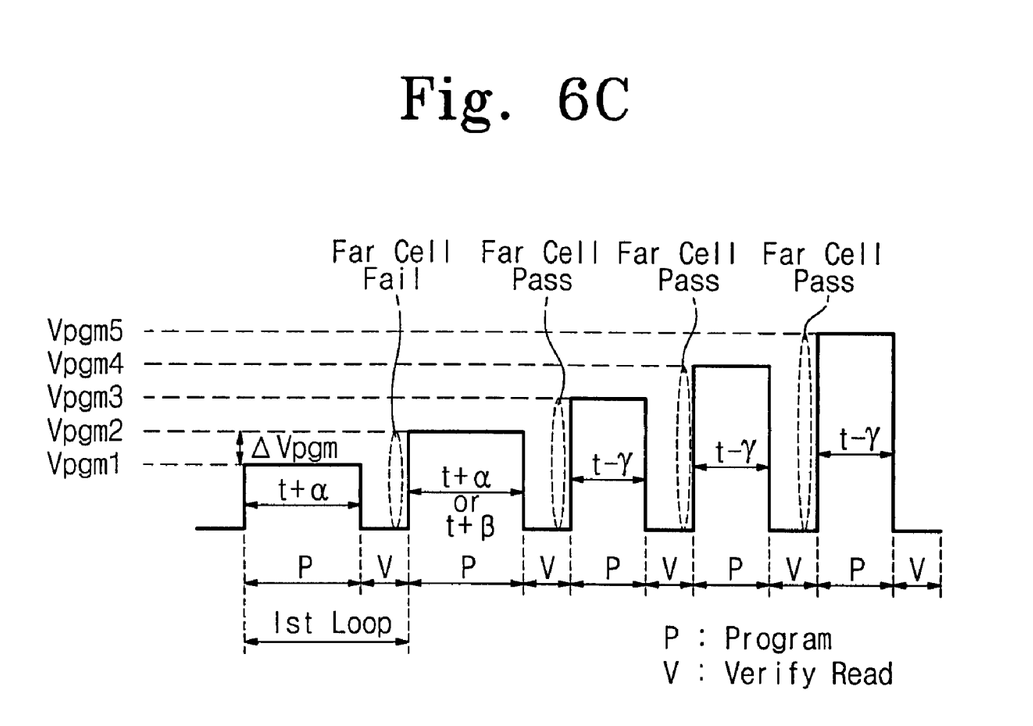

FIGS. 6A through 6C are voltage diagrams illustrating the change in a program voltage for a nonvolatile memory device according to an embodiment of the present invention.

Referring collectively to FIGS. 4 through 6A, a program voltage is applied during a programming period of t–α in a first loop program period P. This is followed by a first loop program verification period "V". At this point, if a programming error is detected in a group of second memory cells ADD1_IO_0 through ADD1_IO_127 associated with the IOs IO_0 through IO_127, control logic unit 171 activates a counter-up signal CNT_UP and a program state enable signal PGM_STATE_EN in response to a verification result of YSCAN_FAIL generated by first P/F verification circuit 161. At this point, address information regarding the failed cell where the verify read operation stops is stored in a data storage unit such as a register under the control of control logic unit 171.

Program voltage adjustor 175 decodes a program step code STEPi determining a level for the program voltage in response to the activated counter-up signal CNT_UP. Word line voltage generating circuit 180 generates a program voltage applied to the next program loop in response to decoded program step code STEPi. Program time adjustor 172 adjusts the application time of the program voltage by adjusting a deactivating point of the program state enable signal PGM_STATE_EN in response to a program verification result (i.e., a program verification result of the far cell) for the activated program state enable signal PGM_STATE_EN and second pass/fail verification circuit 162. In the illustrated example, since the verify operation has been performed up to a second cell of each IO, a second cell ADD2_IO_0 associated with the IO placed the farthest from row decoder circuit 120 becomes the far cell value. Where far cell ADD2_IO_0 is indicated as a failed cell by the verification result of the first program loop, the program state enable signal PGM_STATE_EN is activated following a lapse of t+α time after the program state enable signal PGM_STATE_EN is activated. That is, the length (i.e., the application time for the program voltage) of program period P in the second loop is set to t+α.

Next, a verify read operation is again performed from the second memory cells ADD2_IO_0 through ADD2_IO_127 as indicated by the verify read operation stop in a program verification period "V" of the second program loop. In the verification result, since a program error was detected in a group of second memory cells ADD1_IO_0 through ADD1_IO_127 associated with IOs IO_0 through IO_127, control logic unit 171 stops the verify operation. In this case, the Jth cell ADDj_IO_0 associated with the IO placed farthest from row decoder circuit 120 becomes far cell. Where Far Cell ADDj_IO_0 is successfully programmed, as indicated by a verification result for the second program loop, the application period for the program state enable signal PGM_STATE_EN is reduced to t−α. At this point, a verify operation for a third program loop may be performed for the Jth memory cells ADDj_IO_0 through ADDj_10_127.

Referring to FIGS. 6A through 6C, not only may the programming time be increased or decreases in accordance with the program state of the far cell, but the amount of increase or decrease may be varied. For example, the program period P of each program loop can be set to time period of t−α, t+α, t−β, t+β, t−γ, and t+γ, where α, β, and γ are different values.

Figure 7:
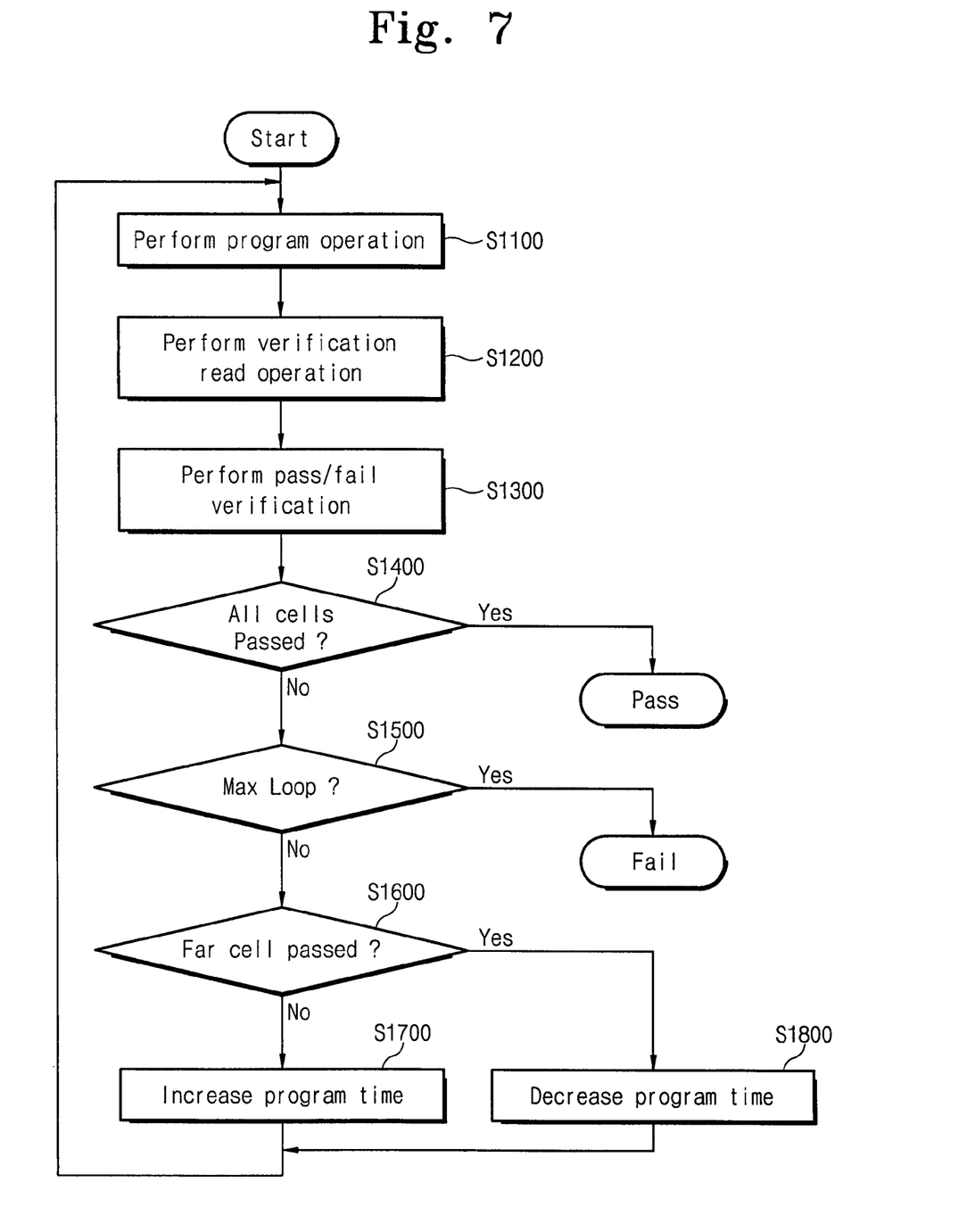
FIG. 7 is a flowchart illustrating a method of programming a nonvolatile memory device according to an embodiment of the present invention.

FIG. 7 is a flowchart illustrating a method for programming a nonvolatile memory device according to an embodiment of the present invention. For explanation purposes, it will be assumed that the method of FIG. 7 is performed using the nonvolatile memory device of FIG. 3. However, the method could be used with a variety of different nonvolatile memory devices. In the description that follows, exemplary method steps will be denoted by parentheses (SXXX) to distinguish them from exemplary device elements, structures, or features such as those illustrated in FIGS. 1 through 6.

Referring to FIG. 7, nonvolatile memory device 100 performs a programming according to an ISPP scheme (S1100).

Next, nonvolatile memory device 100 performs a verification read operation to verify whether or not the performed program operation was successful (S1200). Then, the program operation and the verification read operation are performed by page buffer circuit 130 under the control of controller 170. The data read by the verification read operation is stored in page buffer circuit 130, and is supplied to first P/F verification circuit 161 in a predetermined bit unit (e.g., 128 bits) through column gate circuit 140. At this point, data stored in a far cell is supplied to second P/F verification circuit 162.

First and second P/F verification circuit 161 and 162 perform a program P/F verification on the data of a predetermined bit unit (e.g., 128 bits) supplied through column gate circuit 140 (S1300). During this method step, first P/F verification circuit 161 performs a verify read operation in parallel for a plurality of bits (i.e., 128 bits) supplied from a plurality of physical IOs associated with memory cell array 110. Then, second P/F verification circuit 162 performs a program verification operation for the far cell of memory array 110 in parallel with or following completion of the verify read operation performed by first P/F verification circuit 161.

Following completion of the verify read operation by first and second P/F verification circuits 161 and 162, a determination is made as to whether or not all of the memory cells read during the verify read operation have been successfully programmed (S1400). When all cells have been successfully programmed (S1400=yes), the program process terminates in a pass state. However, when all cells have not been successfully programmed (S1400=no) (i.e., at least one failed cell is detected), another determination is made as to whether or not the current loop is a last (or maximum count) program loop (S1500).

Where the current loop is determined to be the last program loop (S1500=yes), the program process is terminated in a fail state. However, where the current loop is determined to not be the last program (S1500=no), another determination is made as to whether or not the far cell has been successfully programmed on the basis of a program verification result FARCELL_FAIL/FARCELL_PASS from second P/F verification circuit 162 (S1600 with reference to the determination made in S1300).

According to the determination of the programmed state of the far cell, an application time for the program voltage applied during the next program loop is either increased (S1700) or decreased (S1800). The exemplary method then returns to (S1100). That is, where the determination of (S1600=yes) is one verifying that the far cell has been successfully programmed, the application time for the program voltage applied during the next program loop is reduced. The converse is true for a determination that the far cell has not been successfully programmed (S1600=no), According to the nonvolatile memory device and its programming method, a program voltage application time is adjusted in accordance with a program pass/fail determination for a far cell. As a result, the overall programming time for the nonvolatile memory device may be reduced. That is, the program voltage application time is closely related to the overall programming time for an array of nonvolatile memory cells, as well as the possibility of over-programming the memory cells. By minimizing, where possible, the program voltage application time, excessive application times for certain blocks of memory cells (e.g., certain pages of memory cells) may be prevented, thereby improving performance. Additionally, the potential for over programming of the memory may be prevented, thereby improving program reliability.

According to the present invention, a program voltage application time may be adjusted according to the program state of a far cell (i.e., a memory cell located farthest from a corresponding row decoder circuit along a word line). As a result, programming reliability may be enhanced and programming time reduced.

The foregoing exemplary embodiments are teaching examples. Those of ordinary skill in the art will understand that various changes in form and details may be made to the exemplary embodiments without departing from the scope of the invention as defined by the following claims.

What is claimed:

1. A nonvolatile memory device, comprising:
a memory cell array comprising memory cells selected by word lines and bit lines;
a row decoder circuit providing a program voltage to a selected word line;
a first verification circuit providing a first verification result indicating whether or not memory cells in a predetermined bit unit and programmed by the program voltage are successfully programmed;
a second verification circuit providing a second verification result indicating whether or not a far cell within the predetermined bit unit is successfully programmed;
a controller defining a level and an application time for a program voltage applied during a next program loop in response to the first and second verification results;
a word line voltage generating circuit generating the program voltage; and
a word line driver supplying the program voltage to the row decoder during the next program loop.

2. The nonvolatile memory device of claim 1, wherein bit lines in the memory cell array are respectively connected to a plurality of physical input/output (I/O) lines including an I/O line connected to the far cell and communicating a data value for the far cell to the second verification circuit.

3. The nonvolatile memory device of claim 1, wherein the first verification circuit verifies successful programming of the memory cells in the predetermined bit unit in parallel.

4. The nonvolatile memory device of claim 1, wherein the first and second verification results are respectively generated in parallel by the first and second verification circuits.

5. The nonvolatile memory device of claim 1, wherein the controller comprises:
a control logic generating a count-up signal indicating the program loop and a program state enable signal activating the next program loop in response to the first verification result;
a program voltage adjustor generating a program step code corresponding to the level of the program voltage in response to the count-up signal; and
a program time adjustor determining an end point for the program loop in response to the program state enable signal and the second verification result,
wherein the control logic deactivates the program state enable signal in accordance with the determined end point.

6. The nonvolatile memory device of claim 5, wherein the control logic implements a state machine responsive to state information indicating whether or not a current programming operation is successfully completed.

7. The nonvolatile memory device of claim 5, wherein the program time adjustor comprises:

a counter counting an elapsed time following activation of the program state enable signal and generating a corresponding counted value; and
a decoder decoding a program state end signal in response to the counted value and the second verification result.

8. The nonvolatile memory device of claim 7, wherein the decoder delays the program state end signal by a predetermined time when the second verification results indicates a unsuccessful programming of the far cell.

9. The nonvolatile memory device of claim 7, wherein the decoder advances the program state end signal by a predetermined time when the second verification circuit indicates successful programming of the far cell.

10. The nonvolatile memory device of claim 5, wherein the word line driver supplies the program voltage to the row decoder circuit during a period of when the program state enable signal is activated.

11. The nonvolatile memory device of claim 1, wherein the first and second verification circuits are implemented using a wired-OR type circuit or a column scan type circuit.

12. A method for programming a non-voltage memory device having memory cells selected by word lines and bit lines, the method comprising:
applying a program voltage to a selected word line through a row decoder;
verifying whether or not memory cells in a predetermined bit unit programmed by the program voltage are successfully programmed and providing a corresponding first verification result;
verifying whether or not a far cell amongst the memory cells in the predetermined bit unit is successfully programmed and providing a corresponding second verification result; and
adjusting a level and application time for a program voltage applied during a next program loop in response to the first and second verification results.

13. The method of claim 12, wherein the adjusting of the level and application time for the program voltage comprises:
generating a count-up signal indicating the program loop and a program state enable signal activating the next program loop in response to the first verification result;
generating a program step code corresponding to the level of the program voltage in response to the count-up signal;
determining an end point of the program loop in response to the program state enable signal and the second verification result; and
deactivating the program state enable signal according to the determined end point.

14. The method of claim 12, wherein the determining of the program state end point comprises:
counting an elapsed time following activation of the program state enable signal and generating a corresponding counted value; and
generating a program state end signal in response to the counted value and the second verification result.

15. The method of claim 14, wherein the program state end signal is delayed by a predetermined time when the second verification result indicates that the far cell is not successfully programmed.

16. The method of claim 14, wherein the program state end signal is advanced by a predetermined time when the second verification result indicates that the far cell is successfully programmed.

* * * * *